US012666596B2

(12) United States Patent
Kim et al.

(10) Patent No.:    US 12,666,596 B2
(45) Date of Patent:    Jun. 23, 2026

(54) SEMICONDUCTOR MEMORY DEVICE

(71) Applicant: Samsung Electronics Co., Ltd.,
Suwon-si (KR)

(72) Inventors: Suncheul Kim, Suwon-si (KR);
Taeyeon Kwon, Suwon-si (KR);
Younjae Cho, Suwon-si (KR); **Jihoon
Kim, Suwon-si (KR); Hongsung Moon**,
Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 386 days.

(21) Appl. No.: 18/530,748

(22) Filed: Dec. 6, 2023

(65) Prior Publication Data

US 2024/0292598 A1     Aug. 29, 2024

(30) Foreign Application Priority Data

Feb. 28, 2023    (KR) ........................ 10-2023-0027139

(51) Int. Cl.
*H10B 12/00*        (2023.01)
(52) U.S. Cl.
CPC ........... *H10B 12/34* (2023.02); *H10B 12/053*
(2023.02); *H10B 12/315* (2023.02)
(58) Field of Classification Search
CPC .... H10B 12/34; H10B 12/053; H10B 12/315;
H10B 12/482; H10B 12/488; H10B 12/02
See application file for complete search history.

(56) References Cited

U.S. PATENT DOCUMENTS

| | | | |
|---|---|---|---|
| 7,713,831 B2 | 5/2010 | Park et al. | |
| 9,281,373 B2 | 3/2016 | Kang | |
| 9,478,551 B2 * | 10/2016 | Kim ..................... | H10D 62/221 |
| 10,103,152 B2 * | 10/2018 | Kim ..................... | H10B 12/315 |
| 10,685,842 B2 | 6/2020 | Chang et al. | |
| 11,189,622 B1 * | 11/2021 | Yang ..................... | H10B 12/34 |
| 2008/0242084 A1 | 10/2008 | Kim et al. | |
| 2012/0139028 A1 * | 6/2012 | Park ..................... | H10B 12/053 |
| | | | 257/334 |
| 2013/0277748 A1 * | 10/2013 | Lee ..................... | H10D 84/834 |
| | | | 257/288 |
| 2016/0087035 A1 * | 3/2016 | Kim ..................... | H10D 64/691 |
| | | | 257/368 |

(Continued)

FOREIGN PATENT DOCUMENTS

KR        10-0668836 B1    1/2007

*Primary Examiner* — Alexander G Ghyka
(74) *Attorney, Agent, or Firm* — HARNESS, DICKEY &
PIERCE, P.L.C.

(57)        ABSTRACT

A semiconductor memory device may include active regions
defined on a substrate by a device isolation layer, each of the
active regions including a first impurity region and a second
impurity region, word lines on the active regions and
extended in a first direction, capping insulating patterns
covering top surfaces of the word lines, respectively, bit
lines on the word lines and extended in a second direction
crossing the first direction, contact plugs between the bit
lines and connected to the second impurity region, and data
storages on the contact plugs, respectively. Each of the word
lines may include a first metal nitride layer and a second
metal nitride layer on the first metal nitride layer. A resis-
tivity of the second metal nitride layer may be smaller than
a resistivity of the first metal nitride layer.

20 Claims, 24 Drawing Sheets

(56) References Cited

U.S. PATENT DOCUMENTS

| | | |
|---|---|---|
| 2019/0244960 A1* | 8/2019 | Park .................. H10B 12/0335 |
| 2021/0249517 A1 | 8/2021 | Cheng et al. |
| 2022/0223594 A1 | 7/2022 | Lee et al. |
| 2022/0230884 A1 | 7/2022 | Chang et al. |
| 2023/0134208 A1* | 5/2023 | Jang .................... H10B 12/488 |
| | | 257/296 |
| 2023/0164976 A1* | 5/2023 | Park .................... H10B 12/033 |
| | | 257/30 |
| 2024/0074162 A1* | 2/2024 | Haddadin ............ H10B 12/488 |
| 2024/0147709 A1* | 5/2024 | Kim ...................... H10B 12/34 |

* cited by examiner

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2023-0027139, filed on Feb. 28, 2023, in the Korean Intellectual Property Office, the entire contents of which are hereby incorporated by reference.

BACKGROUND

The present disclosure relates to semiconductor devices, and in particular, to semiconductor memory devices and methods of fabricating the same.

Due to their small-sized, multifunctional, and/or low-cost characteristics, semiconductor devices are being esteemed as important elements in the electronics industry. However, with the advancement of the electronics industry, there is an increasing demand for a semiconductor device with higher integration density. To increase the integration density of the semiconductor device, it is necessary to reduce linewidths of patterns constituting the semiconductor device. However, novel and expensive exposure technologies are needed to reduce the linewidths of the patterns, and thus, it becomes difficult to increase the integration density of the semiconductor device. Thus, a variety of new technologies are recently being studied to overcome the difficulty in increasing an integration density of a semiconductor memory device.

SUMMARY

Example embodiments of the inventive concepts provide semiconductor memory devices, which may include a word line with improved structural stability and may have improved electrical characteristics, and methods of fabricating the same.

According to some example embodiments of the inventive concepts, a semiconductor memory device may include active regions defined on a substrate by a device isolation layer, each of the active regions including a first impurity region and a second impurity region, word lines on the active regions and extended in a first direction, capping insulating patterns covering top surfaces of the word lines, respectively, bit lines on the word lines and extended in a second direction crossing the first direction, contact plugs between the bit lines and connected to the second impurity region, and data storages on the contact plugs, respectively. Each of the word lines may include a first metal nitride layer and a second metal nitride layer on the first metal nitride layer. A resistivity of the second metal nitride layer may be smaller than a resistivity of the first metal nitride layer.

According to some example embodiments of the inventive concepts, a semiconductor memory device may include active regions defined on a substrate by a device isolation layer, each of the active regions including a first impurity region and a second impurity region, word lines on the active regions and extended in a first direction, capping insulating patterns covering top surfaces of the word lines, respectively, bit lines on the word lines and extended in a second direction crossing the first direction, contact plugs between the bit lines and connected to the second impurity region, and data storages on the contact plugs, respectively. Each of the word lines may include a first metal nitride layer and a second metal nitride layer on the first metal nitride layer. A work function of the second metal nitride layer may be smaller than a work function of the first metal nitride layer.

According to some example embodiments of the inventive concepts, a semiconductor memory device may include active regions defined on a substrate by a device isolation layer, each of the active regions including a first impurity region and a second impurity region, word lines on the active regions and extended in a first direction, capping insulating patterns covering top surfaces of the word lines, respectively, bit lines on the word lines and extended in a second direction crossing the first direction, contact plugs between the bit lines and connected to the second impurity region, and data storages on the contact plugs, respectively. Each of the word lines may include a first metal nitride layer and a second metal nitride layer on the first metal nitride layer. The first metal nitride layer may include a first element and nitrogen, and the second metal nitride layer may include the first element, the nitrogen, and a second element. The first element may be titanium, and the second element may be silicon.

BRIEF DESCRIPTION OF THE DRAWINGS

FIGS. 4A to 9A are sectional views, which are taken along the lines A1-A2 and B1-B2 of FIG. 1 to illustrate a method of fabricating a semiconductor memory device according to some example embodiments of the inventive concepts.

FIGS. 4B to 9B are sectional views, which are taken along the line C1-C2 of FIG. 1 to illustrate methods of fabricating a semiconductor memory device according to some example embodiments of the inventive concepts.

DETAILED DESCRIPTION

Example embodiments of the inventive concepts will now be described more fully with reference to the accompanying drawings, in which example embodiments are shown.

Figure 1:
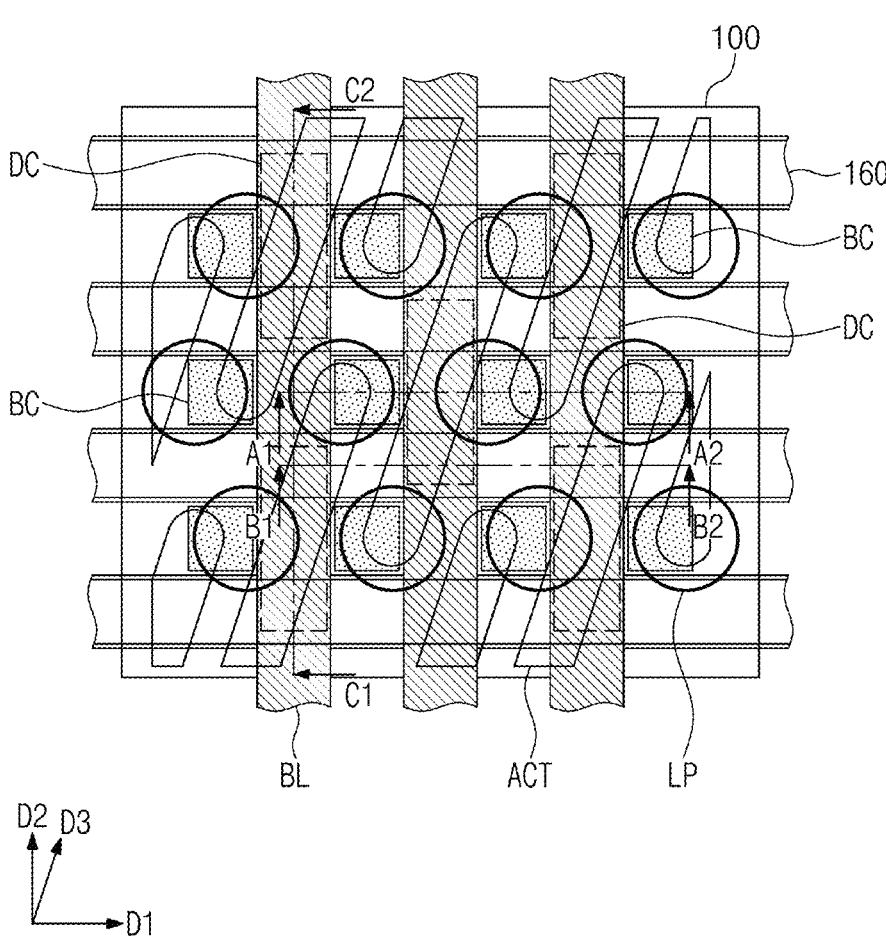
FIG. 1 is a plan view illustrating a semiconductor memory device according to some example embodiments of the inventive concepts.
Figure 2A:
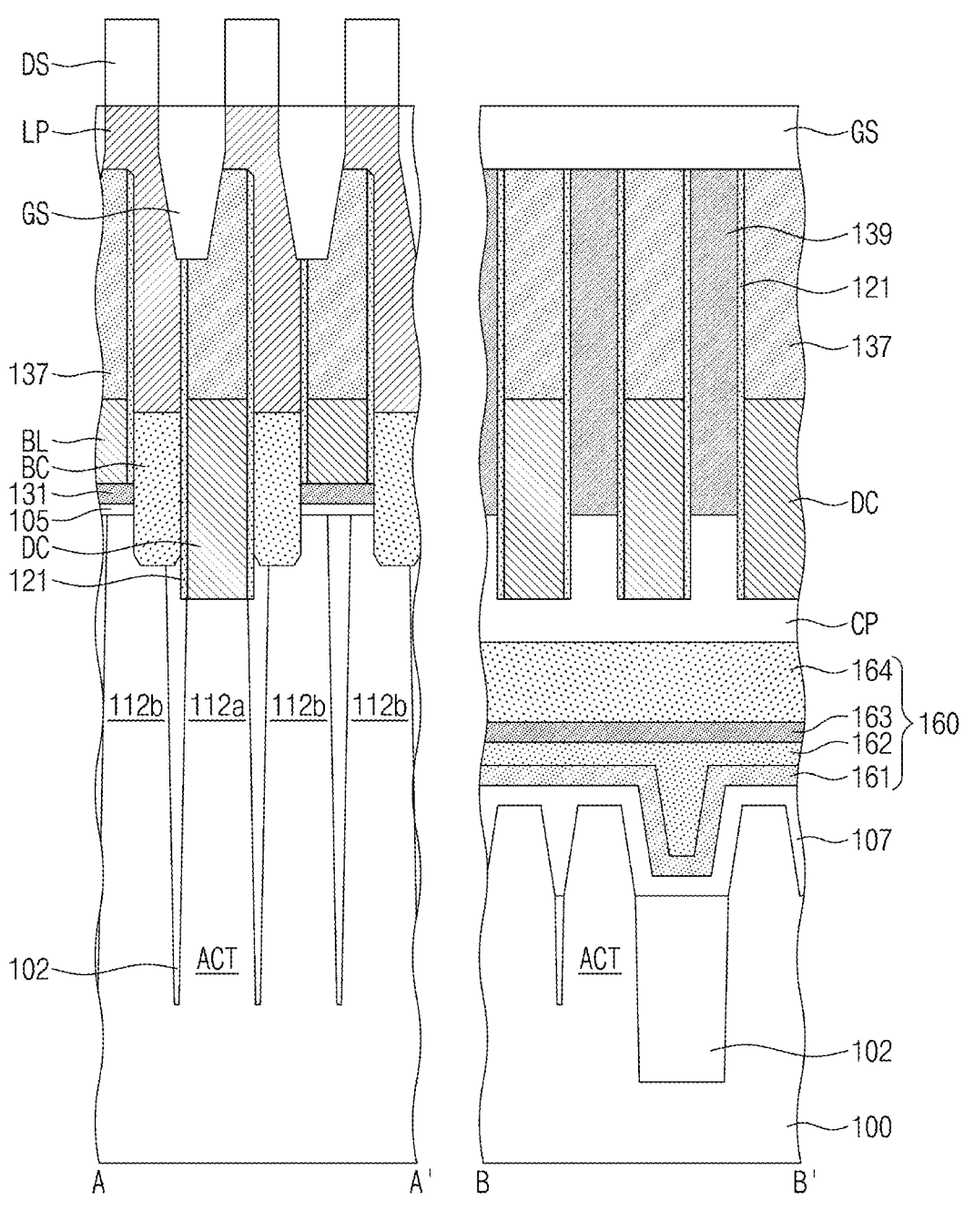
FIG. 2A is a sectional view taken along lines A1-A2 and B1-B2 of FIG. 1.
Figure 2B:
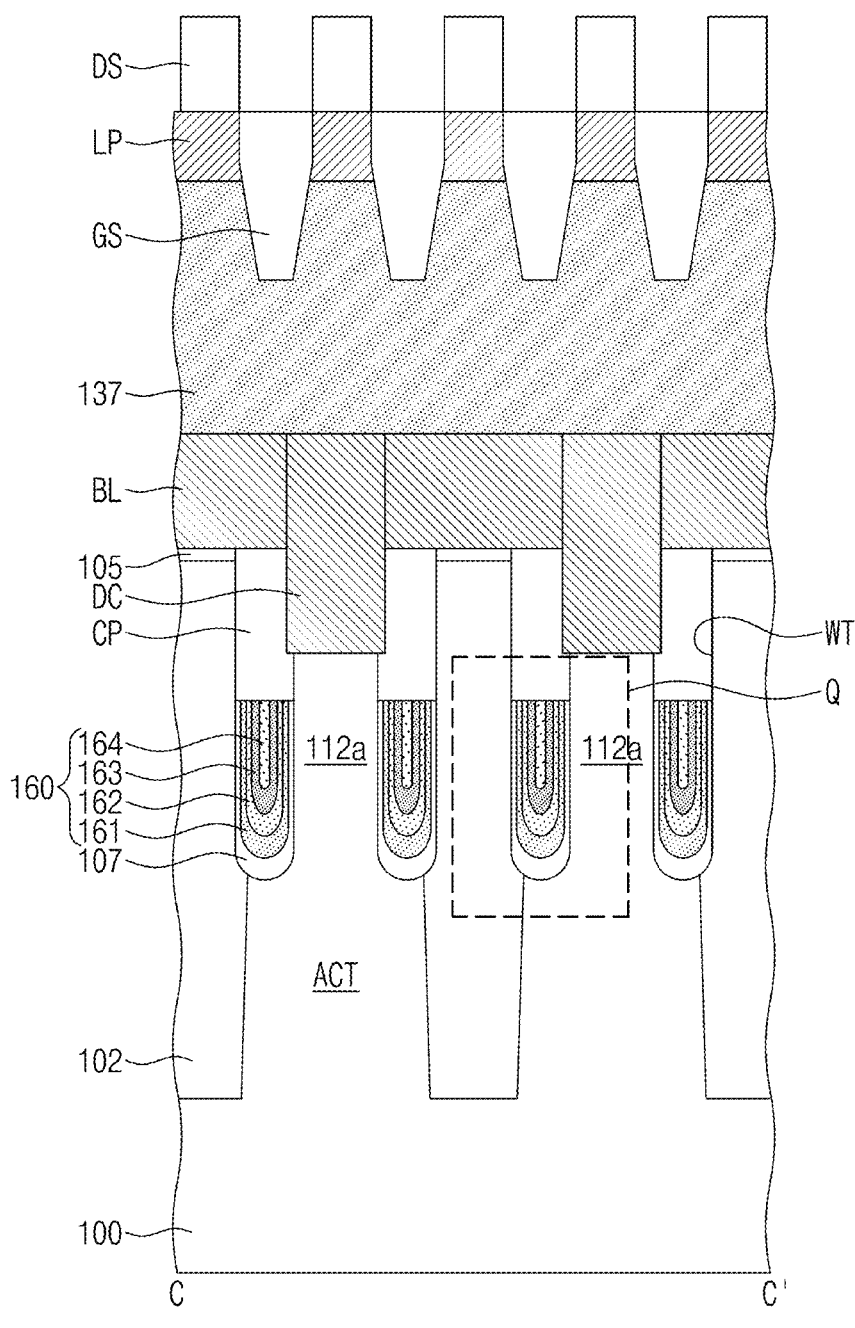
FIG. 2B is a sectional view taken along a line C1-C2 of FIG. 1.
Figure 3:
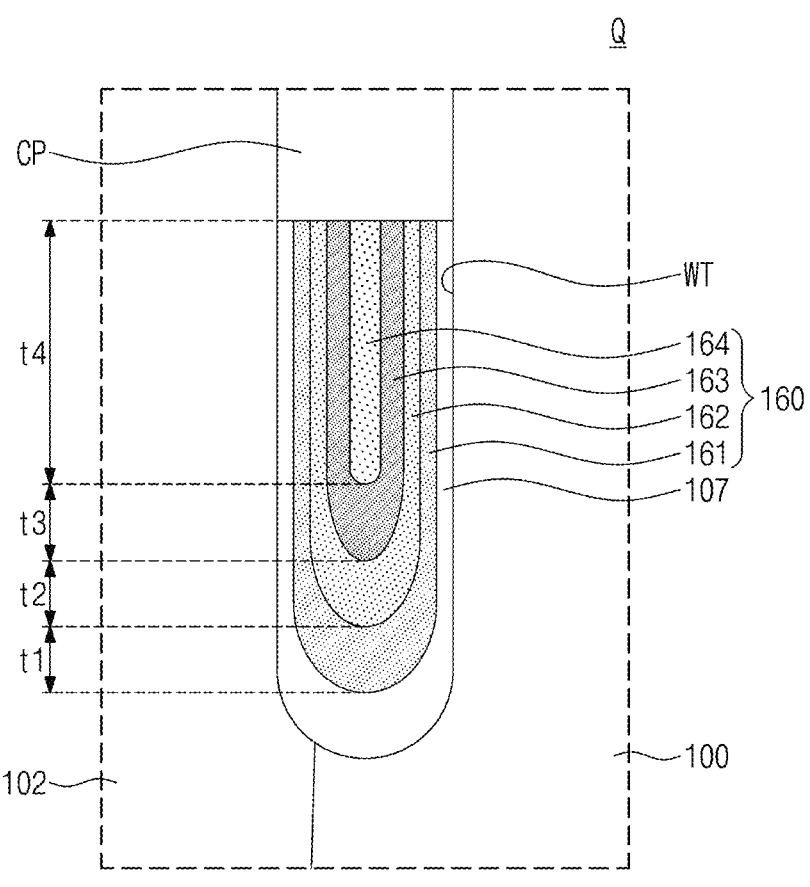
FIG. 3 is an enlarged sectional view illustrating a portion 'Q' of FIG. 2B.

FIG. 1 is a plan view illustrating a semiconductor memory device according to an example embodiment of the inventive concepts. FIG. 2A is a sectional view taken along lines A1-A2 and B1-B2 of FIG. 1. FIG. 2B is a sectional view taken along a line C1-C2 of FIG. 1. FIG. 3 is an enlarged sectional view illustrating a portion 'Q' of FIG. 2B.

Referring to FIGS. 1, 2A, and 2B, a device isolation pattern 102 may be disposed in a substrate 100 to define active regions ACT. The substrate 100 may be a semiconductor substrate, such as a single-crystalline silicon substrate. The active regions ACT may be island-shaped regions, which are separated from each other. Each of the active regions ACT may be a bar-shaped pattern elongated in a third direction D3. When viewed in a plan view, the active regions ACT may be portions of the substrate 100 enclosed by the device isolation pattern 102. The active regions ACT may be arranged in the third direction D3 to be parallel to each other, and each of the active regions ACT may be disposed such that an end portion thereof is located near a center of another active region ACT.

Word lines 160 may be provided to cross the active regions ACT. The word lines 160 may be disposed in trenches WT, respectively, which are formed in the device isolation pattern 102 and the active regions ACT. The word lines 160 may be parallel to a first direction D1 crossing the third direction D3. The word lines 160 may be formed of or include a conductive material. A gate dielectric layer 107 may be disposed between the word line 160 and an inner surface of the trench WT. The gate dielectric layer 107 may be formed of or include at least one of silicon oxide, silicon nitride, silicon oxynitride, or high-k dielectric materials. Each of the active regions ACT may cross a pair of the word lines 160.

A first impurity region 112a may be disposed in a portion of the active region ACT, which is placed between the pair of the word lines 160, and a pair of second impurity regions 112b may be disposed in opposite edge regions of the active region ACT. The first and second impurity regions 112a and 112b may be, for example, n-type doped regions. The first impurity region 112a may correspond to a common drain region, and the second impurity region 112b may correspond to a source region. Each of the word lines 160 and the first and second impurity regions 112a and 112b adjacent thereto may constitute a transistor.

Top surfaces of the word lines 160 may be lower than a top surface of the substrate 100. Bottom surfaces of the word lines 160 may be placed at a position that is determined by a bottom surface of the trench WT. A height of the bottom surface of each trench WT may vary depending on materials defining the bottom surface. A height of a portion of the bottom surface of the word line 160 provided on the active region ACT may be higher than a height of another portion of the bottom surface of the word line 160 provided on the device isolation pattern 102.

Capping insulating patterns CP may be provided to cover the word lines 160, respectively, and may be extended in the first direction D1. The capping insulating patterns CP may be buried in the trenches WT to cover a top surface of the word line 160. Side surfaces of the capping insulating patterns CP may be defined by an inner side surface of the trench WT and may be aligned to a side surface of the gate dielectric layer 107. The capping insulating patterns CP may include a silicon nitride layer or a silicon oxynitride layer.

A buffer insulating layer 105 may be provided on the substrate 100. The buffer insulating layer 105 may include at least one of a silicon oxide layer and/or a silicon nitride layer. The buffer insulating layer 105 may be provided as island-shaped patterns, which are spaced apart from each other when viewed in a plan view.

Bit lines BL may be provided on the word lines 160 to extend in a second direction D2, which is non-parallel to the first direction D1. The bit lines BL may be buried in an upper portion of the substrate 100 and may be connected to the first impurity regions 112a, respectively, through contact portions DC. The contact portions DC may be provided to penetrate the bit lines BL and to be inserted into an upper portion of the substrate 100, but the inventive concept is not limited to this example; for example, the contact portions DC may be disposed below the bit lines BL.

Bit line capping patterns 137 may be disposed on the bit lines BL, respectively. The bit line capping patterns 137 may be formed of or include an insulating material (e.g., silicon nitride). A spacer 121 may be provided to cover opposite side surfaces of each bit line BL. The spacer 121 may be extended to cover side surfaces of the bit line capping patterns 137. The spacer 121 may be formed of or include at least one of silicon nitride, silicon oxide, or silicon oxynitride. The spacer 121 may include a first spacer layer and a third spacer layer, which are formed of silicon nitride, and a second spacer layer, which is formed between the first and third spacer layers and is formed of silicon oxide. In some example embodiments, an air gap may be provided in place of the second spacer layer. The spacer 121 may be extended along the bit line BL and in the second direction D2. The spacer 121 may be extended in the second direction D2 to cover the side surface of the contact portion DC. The contact portion DC may be formed of or include doped poly silicon. The bit lines BL may be formed of or include at least one of metallic materials (e.g., tungsten, titanium, and/or tantalum).

Contact plugs BC may be disposed between an adjacent pair of the bit lines BL. The contact plugs BC may be formed of or include at least one of doped or undoped polysilicon or metallic materials. The contact plugs BC may be two-dimensionally disposed to be spaced apart from each other, as shown in FIG. 1. In some example embodiments, the contact plugs BC, which are arranged in the first direction D1, may be spaced apart from each other with the bit lines BL interposed therebetween. The contact plugs BC, which are arranged in the second direction D2, may be spaced apart from each other with fence portions 139 interposed therebetween. Top surfaces of the fence portions 139 may be higher than top surfaces of the contact plugs BC.

Each of the contact plugs BC may be spaced apart from adjacent ones of the bit line BL with the spacer 121 interposed therebetween. Landing pads LP may be disposed on the contact plugs BC, respectively. The landing pads LP may be formed of or include a metal-containing material (e.g., tungsten). The landing pads LP may be electrically connected to the contact plugs BC, respectively. An upper portion of the landing pad LP may cover a top surface of the bit line capping pattern 137 and may have a width larger than the contact plug BC. A center of the landing pad LP may be shifted from a center of the contact plug BC in the first direction D1 or an opposite direction of the first direction D1, as shown in FIG. 1. Portions of each of the bit lines BL may be vertically overlapped with the landing pads LP. An ohmic layer may be provided between the contact plugs BC and the landing pads LP. The ohmic layer may be a metal silicide layer.

A gap-fill insulating layer GS may be provided to fill a space between the landing pads LP. The gap-fill insulating layer GS may be provided in a recess region that is defined by side surfaces of the landing pads LP and side surfaces of the bit line capping patterns 137. When viewed in a plan view, the gap-fill insulating layer GS may be provided to fill a space between the landing pads LP, which are two-dimensionally separated from each other. As an example, a planar shape of the gap-fill insulating layer GS may be a mesh shape including holes which are pierced by the landing pads LP. The gap-fill insulating layer GS may be formed of or include at least one of silicon nitride or silicon oxynitride.

A data storage DS may be provided on each of the landing pads LP. In the case where the semiconductor memory device is a DRAM device, the data storage DS may include a capacitor. In some example embodiments, the data storage DS may include bottom electrodes, a top electrode, and a dielectric layer.

The word lines 160 will be described in more detail with reference to FIGS. 2A, 2B, and 3.

The word line 160 may include a plurality of metal nitride layers. As an example, the word line 160 may include a first metal nitride layer 161, a third metal nitride layer 162, a second metal nitride layer 163, a fourth metal nitride layer 164, which are sequentially provided on the gate dielectric layer 107 in the trench WT.

A work function of the second metal nitride layer 163 may be smaller than a work function of the first metal nitride layer 161. A resistivity of the second metal nitride layer 163 may be smaller than a resistivity of the first metal nitride layer 161. The first metal nitride layer 161 may contain a first element and nitrogen, and the second metal nitride layer 163 may contain the first element, the nitrogen, and a second element. The third metal nitride layer 162 and the fourth metal nitride layer 164 may include the first element and the nitrogen. The first element may be a metallic element, and the second element may be silicon. The first metal nitride layer 161, the third metal nitride layer 162, and the fourth metal nitride layer 164 may not include silicon. In some example embodiments, the first element may be titanium. In another example embodiment, the first metal nitride layer 161, the third metal nitride layer 162, and the fourth metal nitride layer 164 may be TiN layers, and the second metal nitride layer 163 may be a TiSiN layer. A silicon concentration of the second metal nitride layer 163 may range from 5 at % to 18 at %.

Work functions of the third and fourth metal nitride layers 162 and 164 may be smaller than a work function of the first metal nitride layer 161 and may be greater than a work function of the second metal nitride layer 163. Resistivities of the third and fourth metal nitride layers 162 and 164 may be smaller than the resistivity of the first metal nitride layer 161 and may be greater than the resistivity of the second metal nitride layer 163. The resistivities and the work functions of the first to fourth metal nitride layers 161, 162, 163, and 164 may depend on a ratio between the first element, the nitrogen, and the second element. In some example embodiments, a nitrogen concentration of the first metal nitride layer 161 may be higher than a nitrogen concentration of the third metal nitride layer 162 and a nitrogen concentration of the fourth metal nitride layer 164. That is, a concentration of the first element in the first metal nitride layer 161 may be lower than a concentration of the first element in the third metal nitride layer 162 and a concentration of the first element in the fourth metal nitride layer 164. A content ratio of the first element to nitrogen in the first metal nitride layer 161 may be greater than or equal to 0.7 and may be less than 1.0. In the present specification, a concentration of a specific element may be expressed in terms of atomic percent (at %). The third and fourth metal nitride layers 162 and 164 may have substantially the same nitrogen concentration, but the inventive concepts are not limited to this example.

In some example embodiments, a first thickness t1 of the first metal nitride layer 161 may be substantially equal to a second thickness t2 of the third metal nitride layer 162 and a third thickness t3 of the second metal nitride layer 163. A fourth thickness t4 of the fourth metal nitride layer 164 may be larger than each of the first, second, and third thicknesses t1, t2, and t3. In some example embodiments, the third thickness t3 may be larger than each of the first and second thicknesses t1 and t2.

Each of the first metal nitride layer 161, the third metal nitride layer 162, the second metal nitride layer 163, and the fourth metal nitride layer 164 may be in contact with a bottom surface of the capping insulating pattern CP. The first metal nitride layer 161, the third metal nitride layer 162, and the second metal nitride layer 163 may have a U-shaped section.

According to some example embodiments of the inventive concepts, a plurality of metal nitride layers having different work functions may be used as a part of a word line. In the case where an upper portion of the word line is formed of poly silicon, a thickness of a metal nitride layer formed thereunder may be reduced, and in this case, a stress may be concentrated on a thin portion of the metal nitride layer, resulting in a cutting issue of the word line or an excessive increase of resistance of the word line. According to some example embodiments of the inventive concepts, the word line may be composed of metal nitride layers, without a poly silicon layer, and in this case, by adjusting work functions of the metal nitride layers, it may be possible to reduce or minimize a gate induced drain leakage (GIDL) effect and improve the structural stability of the word line. In addition, due to a silicon-containing metal nitride layer, it may be possible to reduce or prevent a metal nitride layer under the silicon-containing metal nitride layer from being oxidized and reduce in likelihood or prevent a void from being formed in the word line.

FIGS. 4A to 9A are sectional views, which are taken along the lines A1-A2 and B1-B2 of FIG. 1 to illustrate a method of fabricating a semiconductor memory device according to some example embodiments of the inventive concepts. FIGS. 4B to 9B are sectional views, which are taken along the line C1-C2 of FIG. 1 to illustrate methods of fabricating semiconductor memory devices according to some example embodiments of the inventive concepts.

Figure 4A:
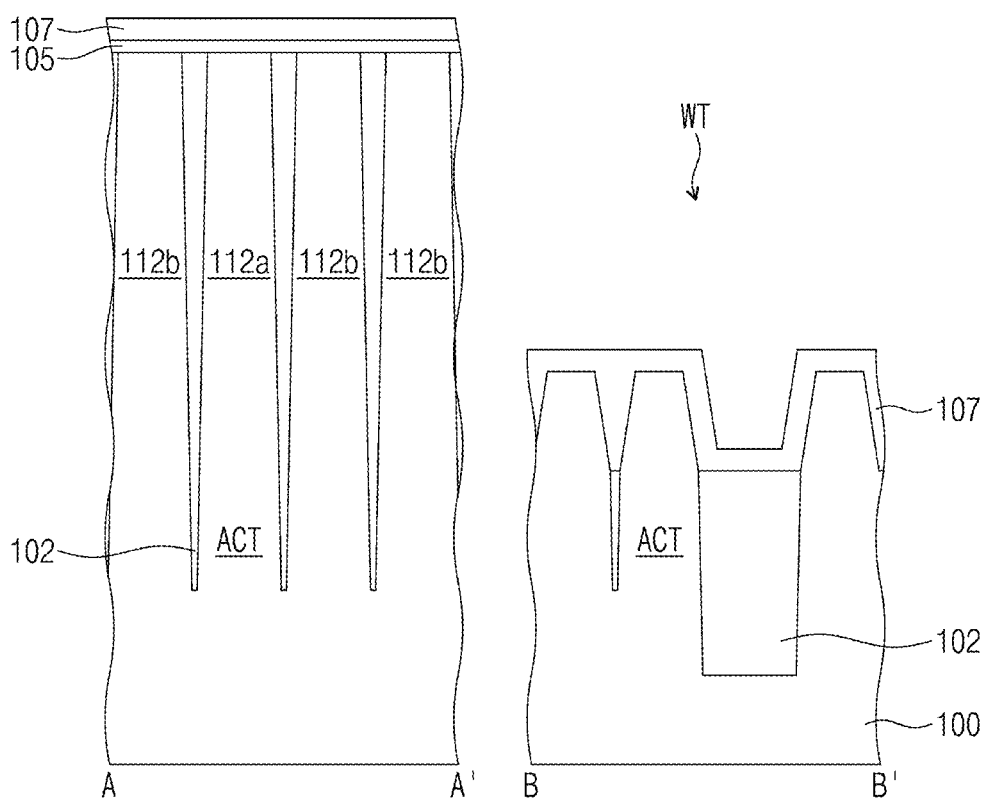
Figure 4B:
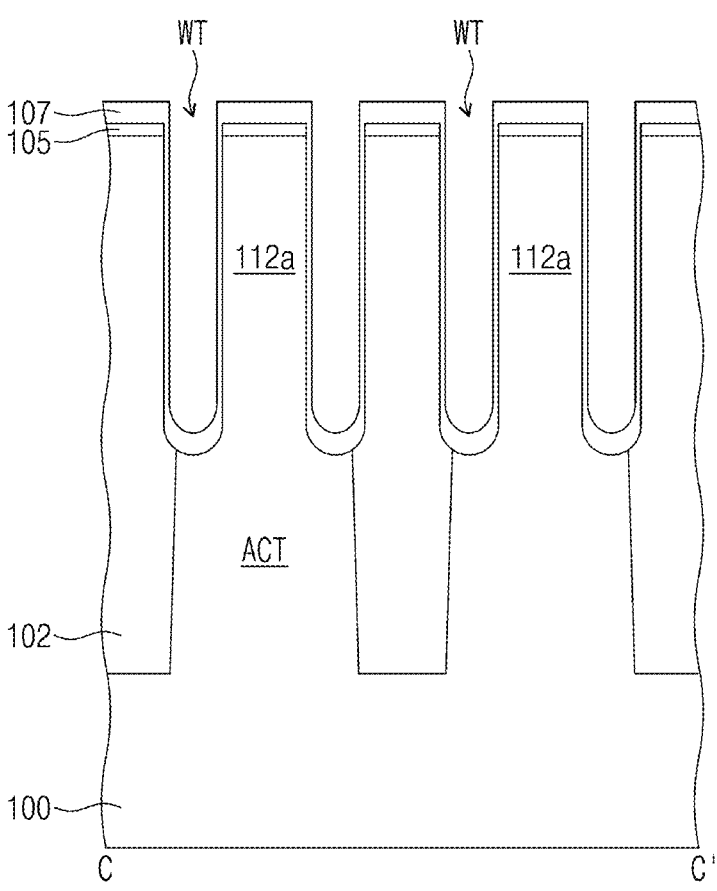

Referring to FIGS. 1, 4A, and 4B, the device isolation pattern 102 may be formed in the substrate 100 to define the active regions ACT. The device isolation pattern 102 may be formed by forming grooves in the substrate 100 and filling the grooves with an insulating material. A depth of the device isolation pattern 102 may vary depending on a distance between the active regions ACT. The device isolation pattern 102 may be formed of or include silicon oxide.

The buffer insulating layer 105 may be formed on the substrate 100 provided with the device isolation pattern 102. The buffer insulating layer 105 may be formed of or include at least one of silicon oxide and/or silicon nitride. Impurities may be injected into the active regions ACT. Accordingly, the first and second impurity regions 112a and 112b may be formed in the active regions ACT. The first and second impurity regions 112a and 112b may have a conductivity type different from the substrate 100. In the case where the substrate 100 has a p-type conductivity, each of the first and second impurity regions 112a and 112b may have an n-type conductivity.

The trenches WT may be formed in an upper portion of the substrate 100 by forming a mask pattern and performing an etching process using the same. Each of the trenches WT may be extended in the first direction D1. The trenches WT may be formed to penetrate the buffer insulating layer 105 and may be extended into the device isolation pattern 102 and an upper portion of the substrate 100. A height of the bottom surface of the trench WT may vary depending on materials defining the bottom surface. In some example embodiments, the device isolation pattern 102 may be etched at an etch rate higher than that of the substrate 100.

The gate dielectric layer 107 may be formed to cover the trenches WT. The gate dielectric layer 107 may be formed by a thermal oxidation process, a chemical vapor deposition process, and/or an atomic layer deposition process.

Figure 5A:
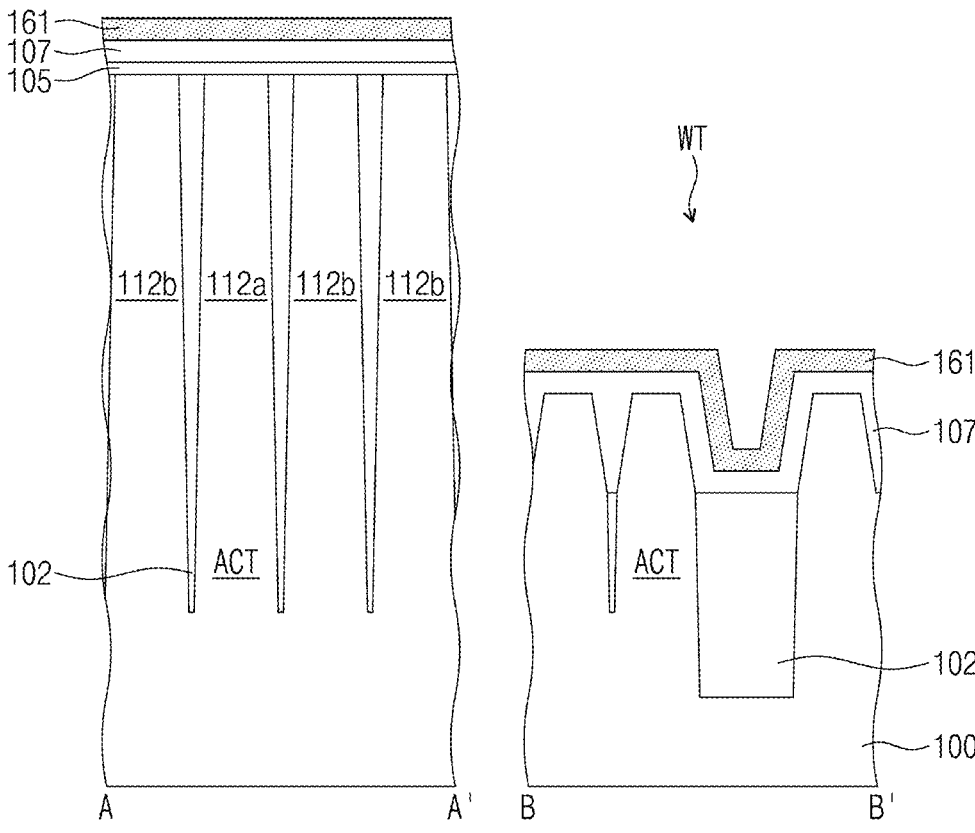
Figure 5B:
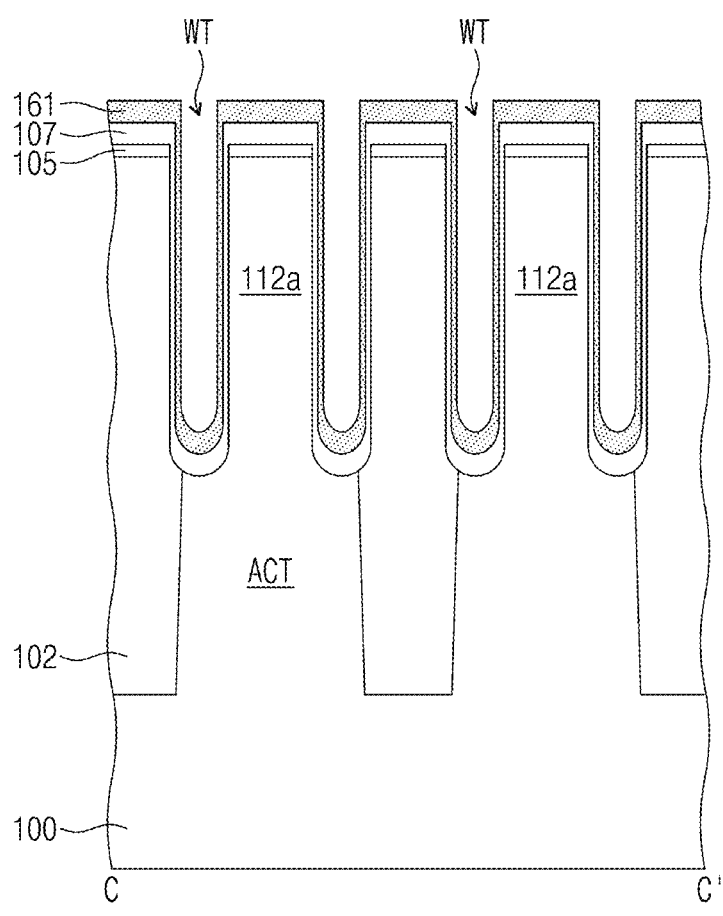

Referring to FIGS. 1, 5A, and 5B, the first metal nitride layer 161 may be formed on the gate dielectric layer 107. The first metal nitride layer 161 may be formed by an atomic layer deposition (ALD) process. The first metal nitride layer 161 may contain a first element and nitrogen. In some example embodiments, the first metal nitride layer 161 may include a TiN layer, and a content ratio of titanium to nitrogen in the first metal nitride layer 161 may be greater than or equal to 0.7 and may be less than 1.0. A composition of the first metal nitride layer 161 may be controlled by adjusting a process cycle in the ALD process of injecting a source gas of the first element and a source gas of the nitrogen. In some example embodiments, the source gas of the first element may be $TiCl_4$, and the source gas of the nitrogen may be $NH_3$.

The composition of the first metal nitride layer 161 may be adjusted by a first treatment process. The first treatment process may be performed in an in-situ manner. In the present specification, the in-situ process may refer to a process, which is performed within a process chamber in a vacuum state. In some example embodiments, the first treatment process may be an additional deposition cycle, which is additionally performed in an ALD process chamber.

Figure 6A:
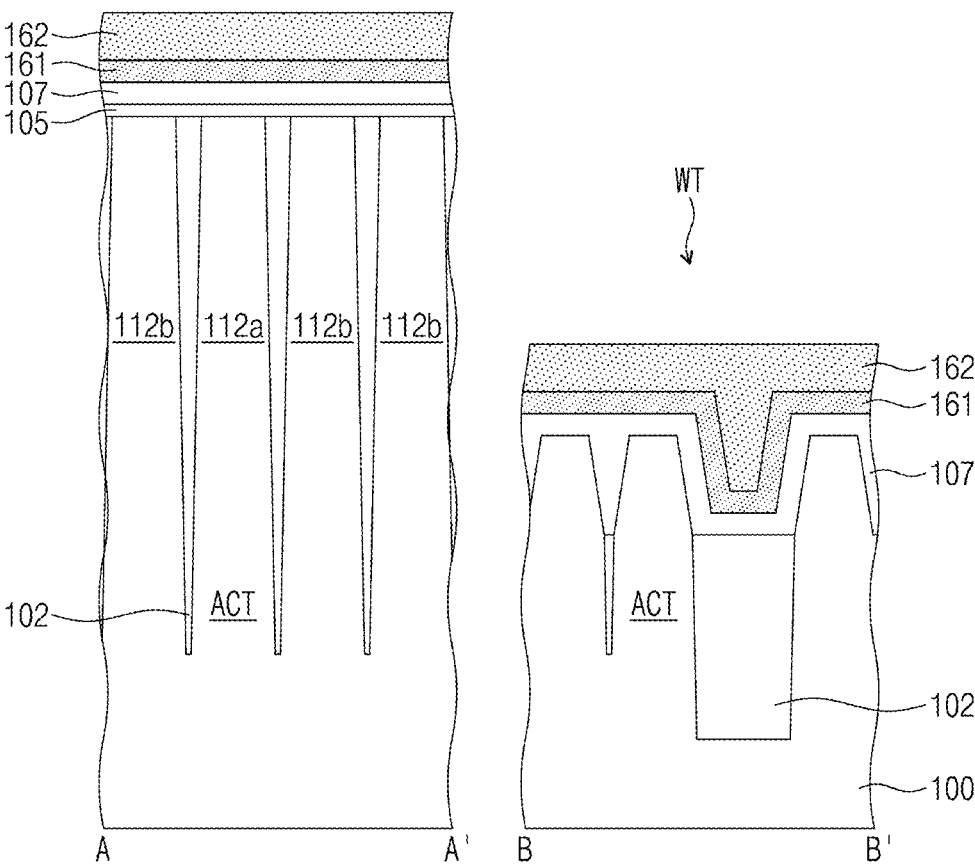
Figure 6B:
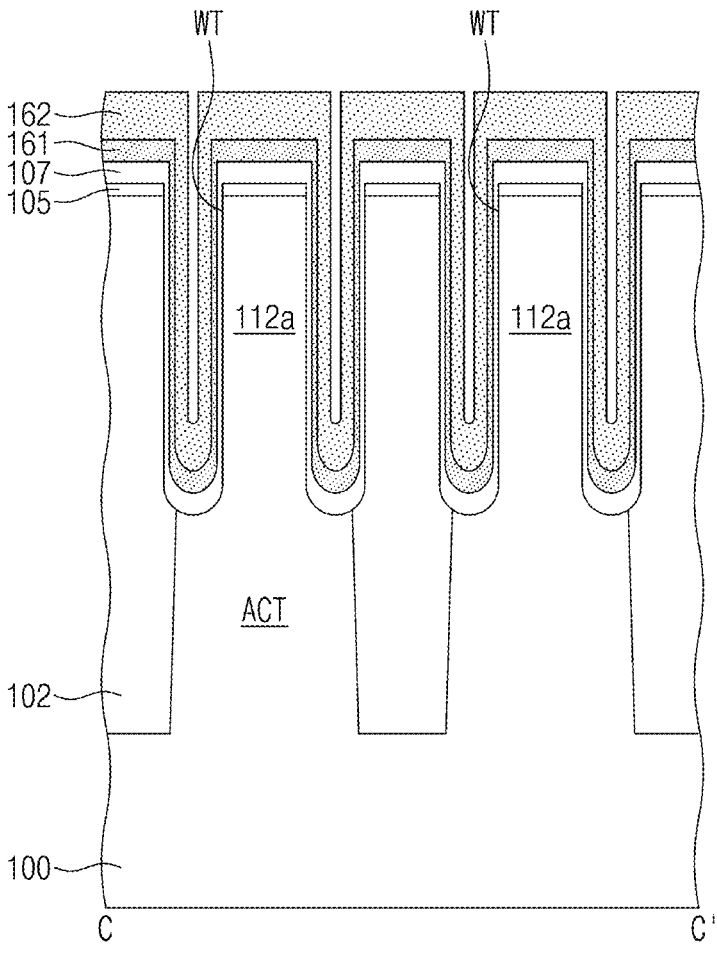

Referring to FIGS. 1, 6A, and 6B, the third metal nitride layer 162 may be formed on the first metal nitride layer 161. The third metal nitride layer 162 may be formed by an ALD process in the same process chamber as that for the first metal nitride layer 161. The third metal nitride layer 162 may be formed by repeating a process of injecting the source gases of the first element and the nitrogen, similar to the first metal nitride layer 161. The third metal nitride layer 162 may be formed such that a content of the first element therein is higher than that in the first metal nitride layer 161. That is, the first metal nitride layer 161 may be formed to have a nitrogen concentration higher than that of the third metal nitride layer 162. In some example embodiments, the third metal nitride layer 162 may include a TiN layer, and here, a content ratio of titanium to nitrogen in the third metal nitride layer 162 may be higher than that in the first metal nitride layer 161. The third metal nitride layer 162 may be formed to be thicker than the first metal nitride layer 161. The third metal nitride layer 162 may not fill the entirety of the trenches WT.

Figure 7A:
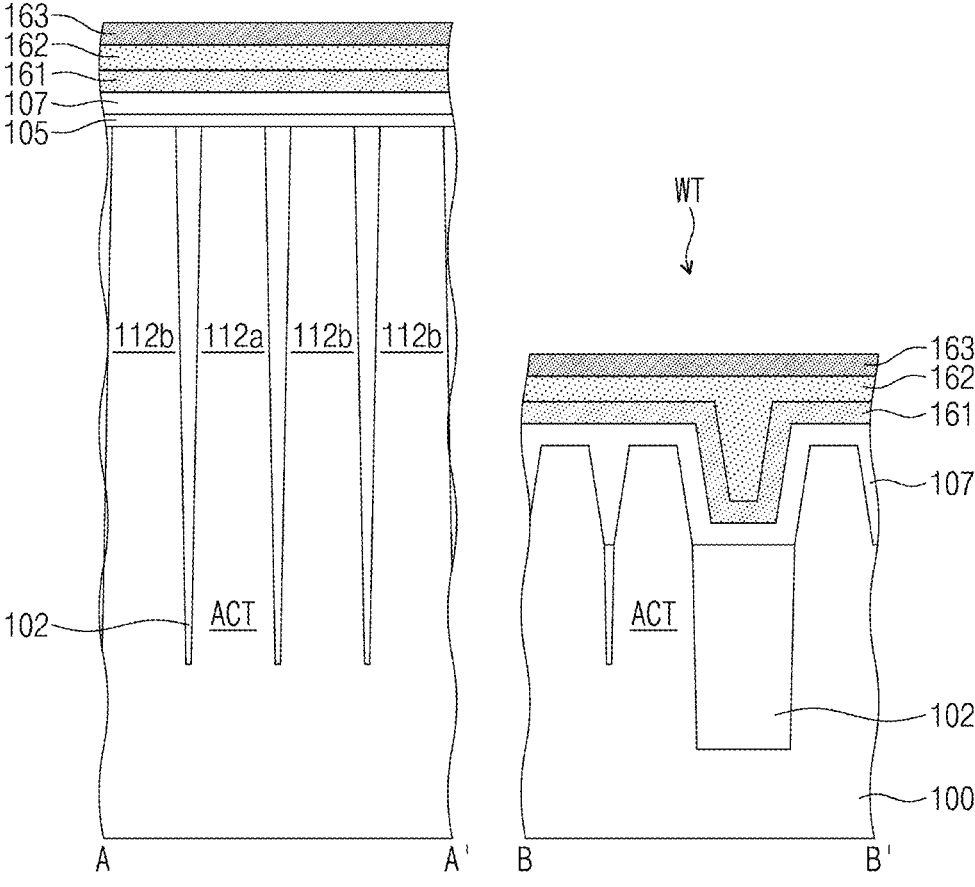
Figure 7B:
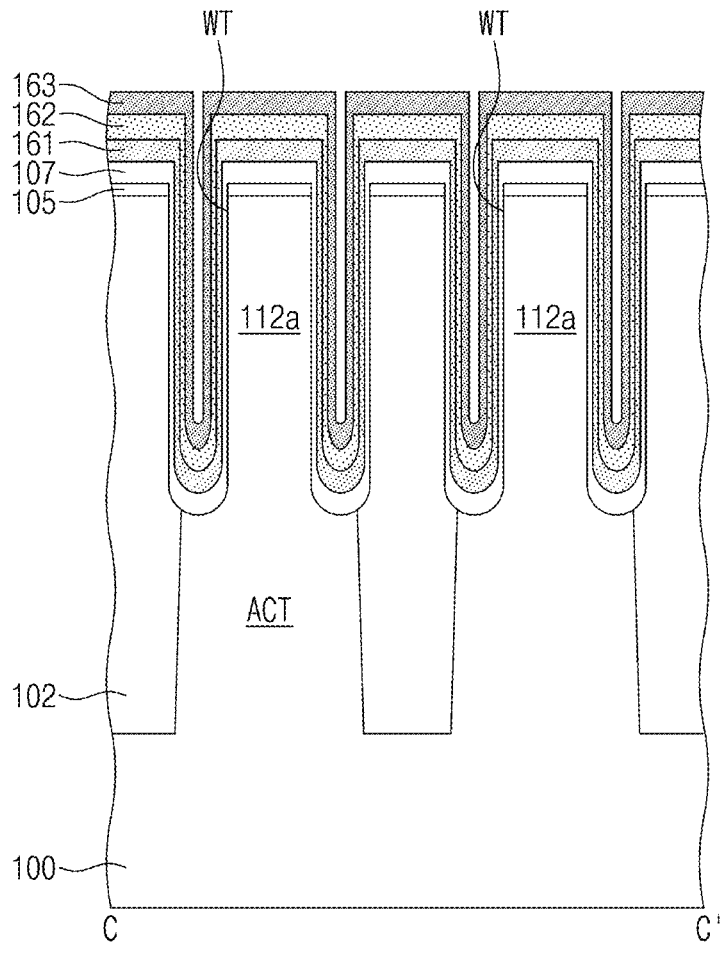

Referring to FIGS. 1, 7A, and 7B, the second metal nitride layer 163 may be formed by performing a second treatment process on an upper portion of the third metal nitride layer 162. That is, as a result of the second treatment process, the upper portion of the third metal nitride layer 162 may form the second metal nitride layer 163. The second treatment process may be performed in an in-situ manner. The second treatment process may include supplying a silicon source into a chamber. The silicon source may contain at least one of $SiH_4$, $SiH_3Cl$, $SiH_2Cl_2$, $HSiCl_3$, $SiCl_4$, $Si_2H_6$, hexachlorodisilane (HCDS) ($Si_2Cl_6$), diisopropylaminosilane (DIPAS) ($SiC_6H_{17}N$), tri(dimetrylamino)silane (TDMAS), HSi ($(N(CH_3)_2)_3$), bis(dietylamino)silane (BDEAS), or $H_2Si((N(C_2H_5)_2)_2)$. The upper portion of the third metal nitride layer 162 may be doped with silicon atoms by the second treatment process. The silicon concentration of the second metal nitride layer 163 may range from 5 at % to 18 at %. The second metal nitride layer 163 may be a TiSiN layer. The silicon concentration of the second metal nitride layer 163 may decrease as a distance from its top surface increases in a direction toward the third metal nitride layer 162, but the inventive concepts are not limited to this example. For example, the second metal nitride layer 163 may have substantially the same silicon concentration as a distance from the top surface of the metal nitride layer increases.

Figure 8A:
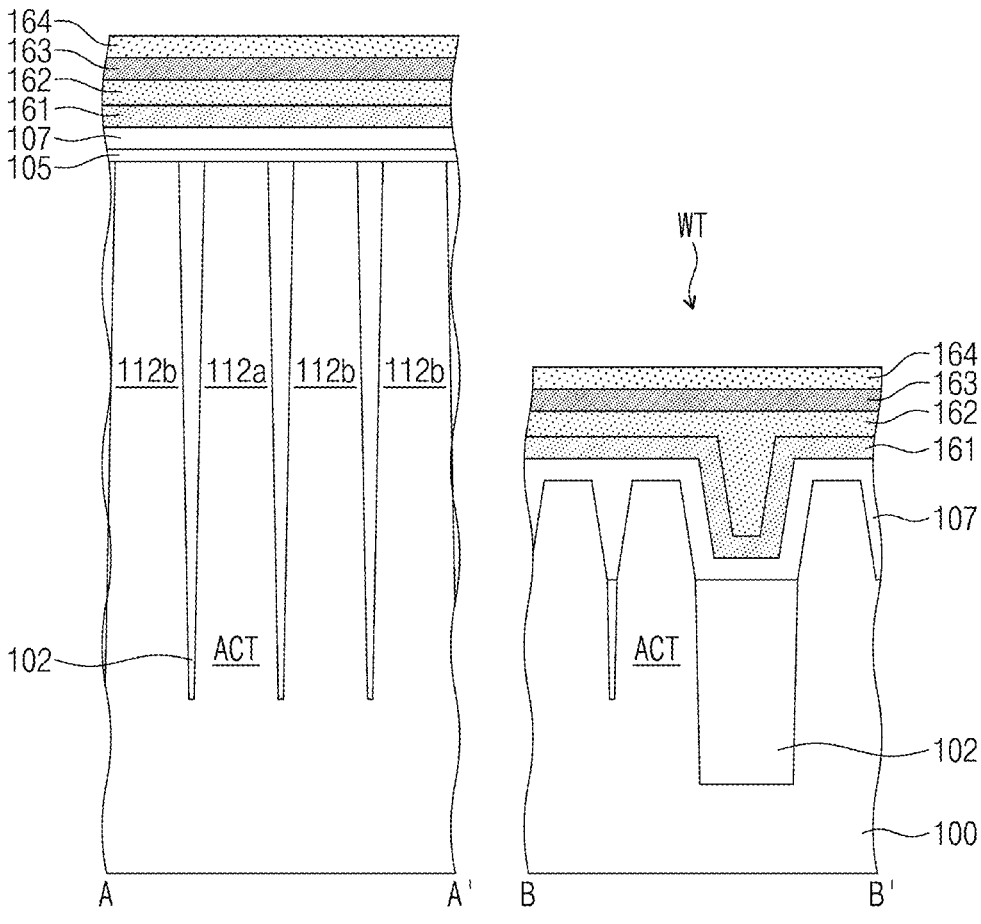
Figure 8B:
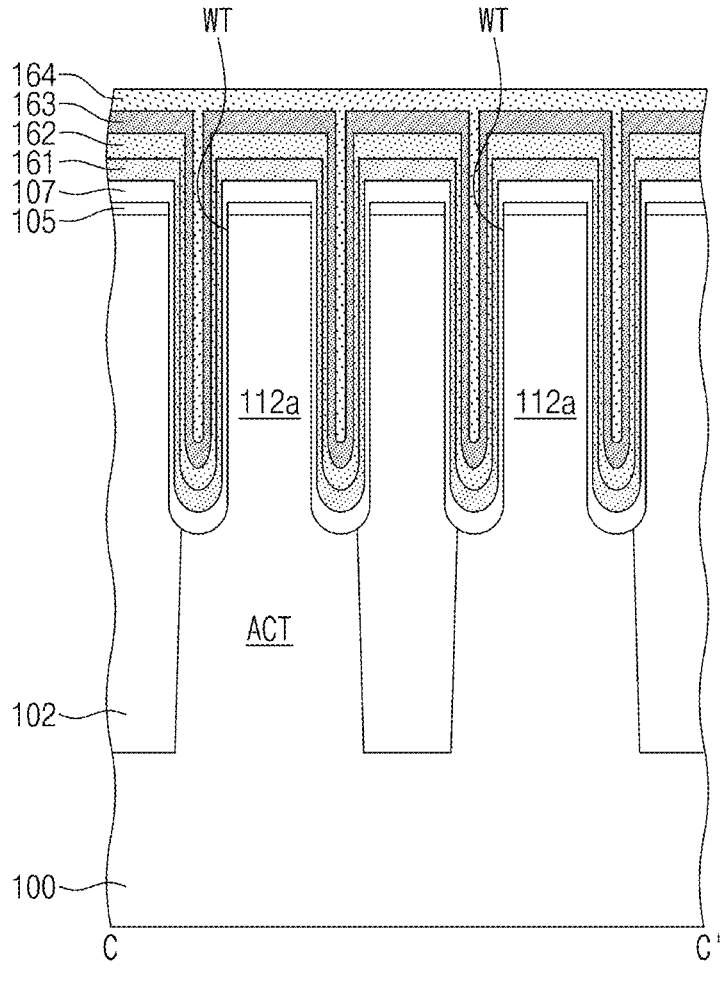

Referring to FIGS. 1, 8A, and 8B, the fourth metal nitride layer 164 may be formed on the second metal nitride layer 163. The fourth metal nitride layer 164 may be formed in the same process chamber as that for the first metal nitride layer 161 by an ALD process. The fourth metal nitride layer 164 may be formed by repeating a process of injecting the source gases of the first element and the nitrogen, similar to the first metal nitride layer 161. The fourth metal nitride layer 164 may be formed such that a content of the first element therein is higher than the content of the first element in the first metal nitride layer 161. That is, the first metal nitride layer 161 may be formed to have a nitrogen concentration higher than that of the fourth metal nitride layer 164. In some example embodiments, the fourth metal nitride layer 164 may include a TiN layer, and a content ratio of titanium to nitrogen in the fourth metal nitride layer 164 may be higher than that in the first metal nitride layer 161. The third and fourth metal nitride layers 162 and 164 may have substantially the same nitrogen concentration, but the inventive concepts are not limited to this example. The fourth metal nitride layer 164 may be provided to fully fill the trenches WT.

Figure 9A:
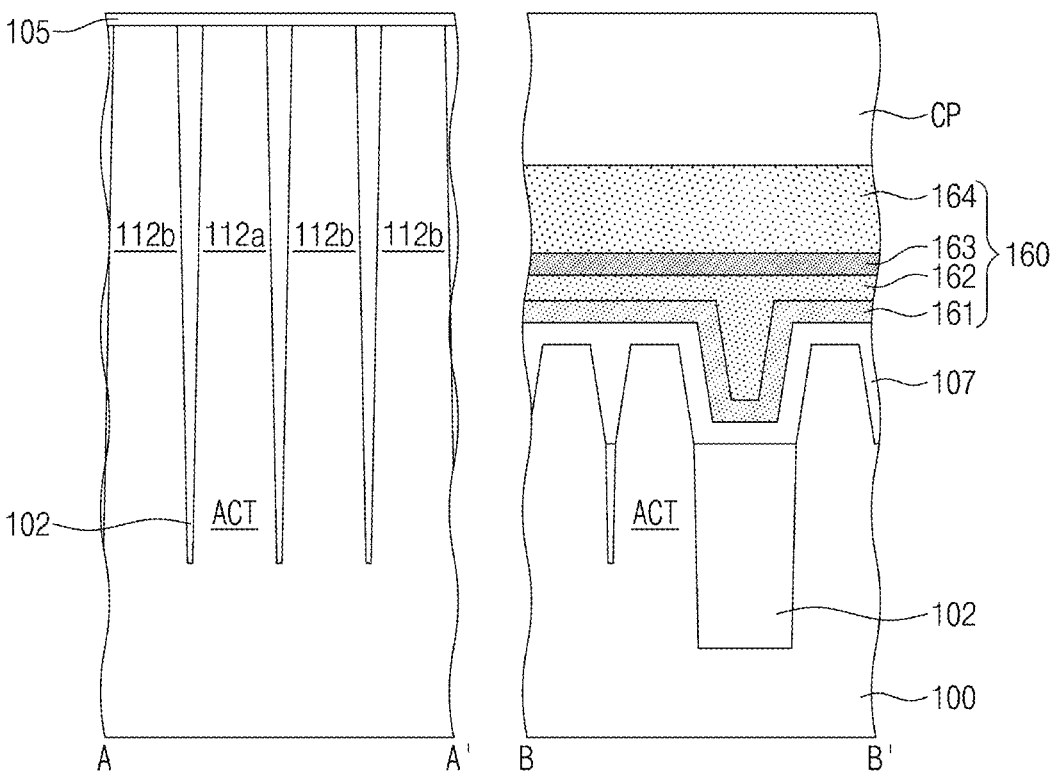
Figure 9B:
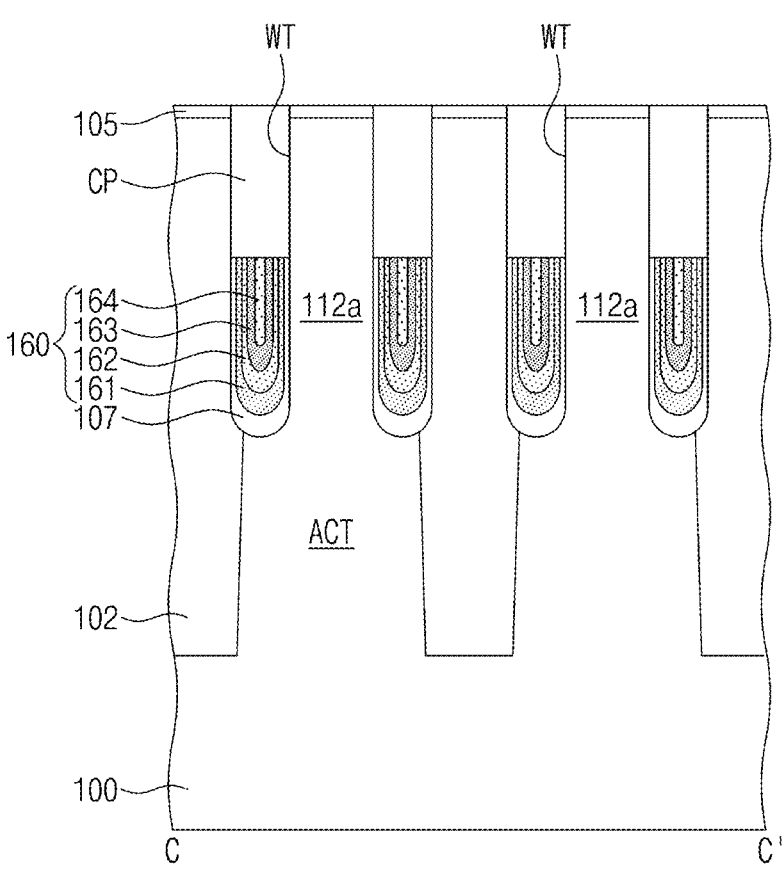

Referring to FIGS. 1, 9A, and 9B, an etch-back process may be performed to remove upper portions of the first to fourth metal nitride layers 161, 162, 163, and 164, and then, the capping insulating patterns CP may be formed in the removed upper regions of the trenches WT. Accordingly, the formation of the word lines 160 may be finished. The capping insulating patterns CP may be formed of or include at least one of silicon nitride or silicon oxynitride. The capping insulating patterns CP may be formed by a chemical vapor deposition process. In some example embodiments, the formation of the capping insulating patterns CP may include a process of forming an insulating layer and performing a planarization process. In some example embodiments, the planarization process may be a chemical mechanical polishing process. The buffer insulating layer 105 may be exposed by the planarization process.

Referring back to FIGS. 1, 2A, and 2B, the bit lines BL, the contact portions DC, and the bit line capping patterns 137 may be formed. The bit lines BL may be formed of or include at least one of tungsten, titanium, or tantalum. The bit lines BL may be formed by forming the bit line capping patterns 137 and then performing an etching process using the bit line capping patterns 137 as an etch mask. The bit line capping patterns 137 may be formed of or include at least one of insulating materials (e.g., silicon nitride). The spacer 121 may be formed to cover a side surface of the bit line BL and side surfaces of the bit line capping patterns 137. The spacer 121 may be formed of or include silicon nitride.

The fence portions 139 may be formed between the bit lines BL, which are extended in the second direction D2, and then, regions, which are defined by the bit lines BL and the fence portions 139, may be etched to expose the second impurity regions 112b. The contact plugs BC, which are connected to the exposed second impurity regions 112b, the formation of. The contact plugs BC may be formed of or include at least one of doped or undoped polysilicon or metallic materials.

A landing pad layer may be formed on the contact plugs BC, and then, an anisotropic etching process may be performed to form the landing pads LP, which are separated from each other. The landing pads LP may be formed of or include tungsten. The gap-fill insulating layer GS may be formed to fill a space between the landing pads LP, which are separated from each other. The gap-fill insulating layer GS may be formed of or include at least one of silicon nitride or silicon oxynitride.

The data storage DS may be formed on each of the landing pads LP. The formation of the data storage DS may include forming bottom electrodes on the landing pads LP, respectively, and forming a dielectric layer and a top electrode to sequentially cover the bottom electrodes.

According to some example embodiments of the inventive concepts, a plurality of metal nitride layers having different work functions may be formed by adjusting a process cycle in an ALD process. Since the layers having different work functions may be formed by an in-situ process, a degree of freedom of a fabrication process may be improved.

Figure 10A:
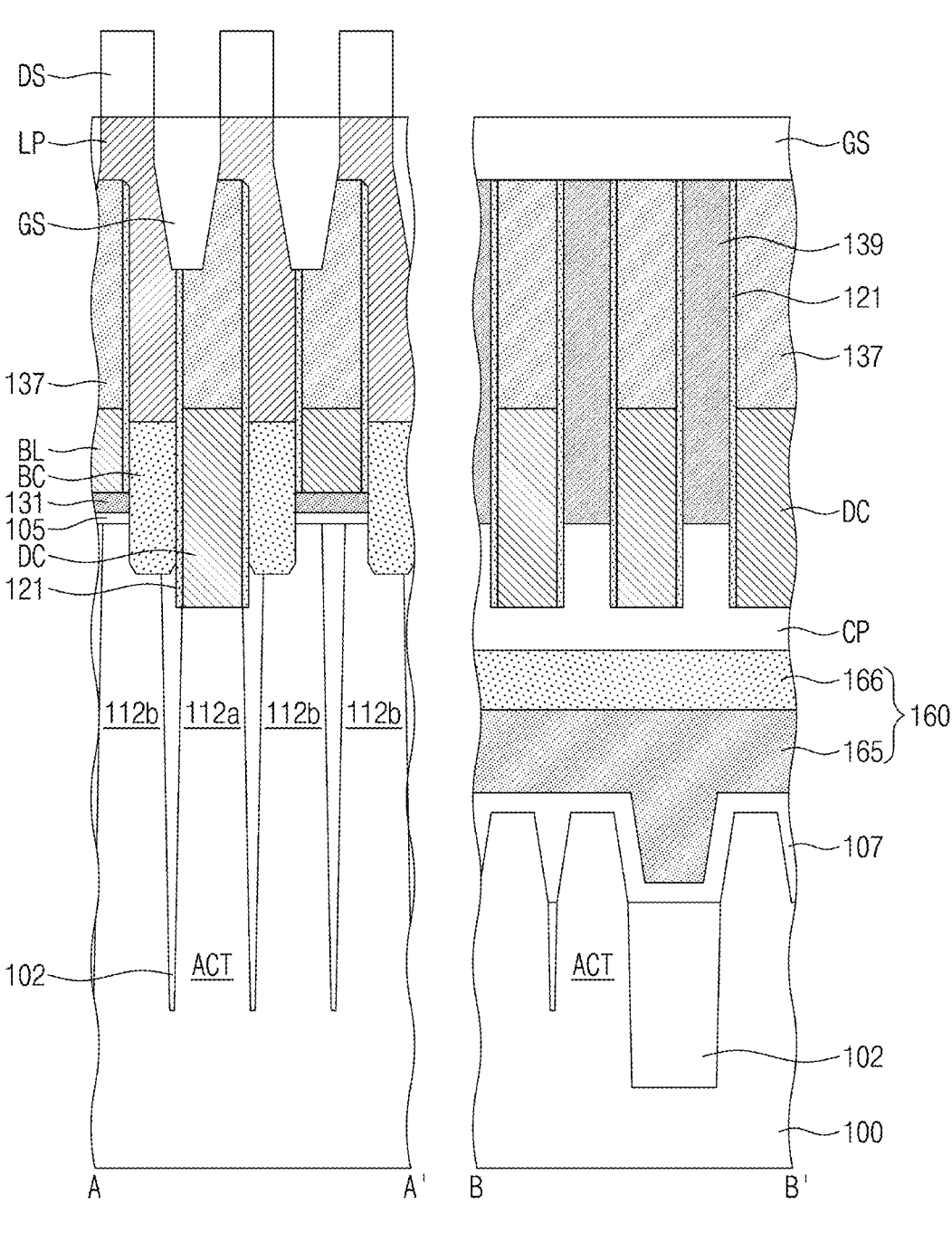
FIG. 10A is a sectional view taken along the lines A1-A2 and B1-B2 of FIG. 1.
Figure 10B:
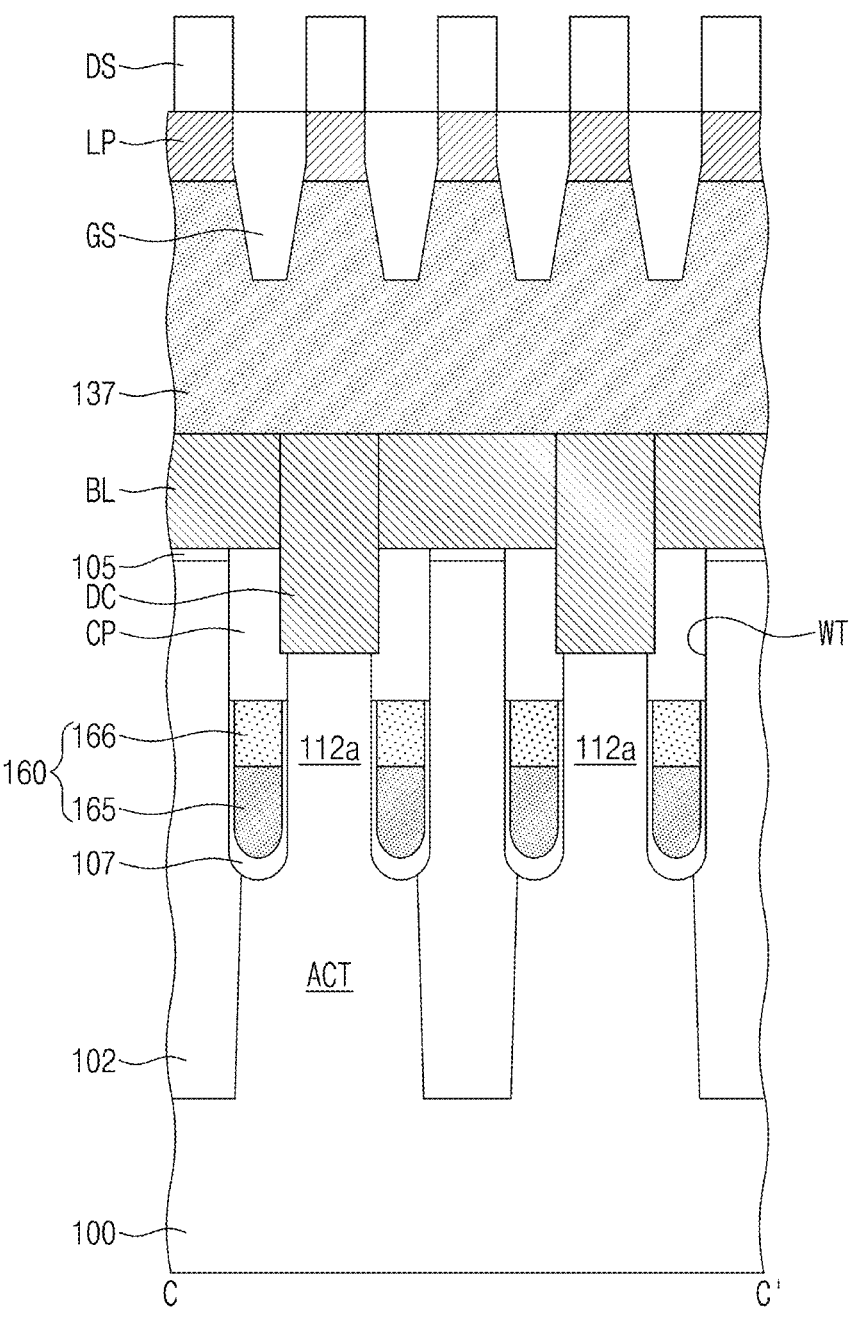
FIG. 10B is a sectional view, which is taken along the line C1-C2 of FIG. 1.

FIG. 10A is a sectional view taken along the lines A1-A2 and B1-B2 of FIG. 1. FIG. 10B is a sectional view, which is taken along the line C1-C2 of FIG. 1. For concise description, a previously described element may be identified by the same reference number without repeating an overlapping description thereof.

Referring to FIGS. 10A and 10B, the word line 160 may include a plurality of metal nitride layers. In some example embodiments, the word line 160 may include a first metal nitride layer 165 and a second metal nitride layer 166, which are sequentially provided on the gate dielectric layer 107 in the trench WT.

A work function of the second metal nitride layer 166 may be smaller than a work function of the first metal nitride layer 165. A resistivity of the second metal nitride layer 166 may be smaller than a resistivity of the first metal nitride layer 165. The first metal nitride layer 165 may contain the first element and the nitrogen, and the second metal nitride layer 166 may contain the first element, the nitrogen, and the second element. The first element may be a metallic element, and the second element may be at least one of silicon (Si), tungsten (W), boron (B), aluminum (Al), lanthanum (La), tantalum (Ta), or yttrium (Y). The first metal nitride layer 165 may not contain the second element. In some example embodiments, the first element may be titanium. As an example, the first metal nitride layer 165 may be a TiN layer, and the second metal nitride layer 166 may be a TiSiN layer. A concentration of the second element in the second metal nitride layer 166 may range from 5 at % to 18 at %. A nitrogen concentration of the first metal nitride layer 165 may be higher than a nitrogen concentration of the second metal nitride layer 166.

A thickness of the first metal nitride layer 165 may be larger than a thickness of the second metal nitride layer 166. The first metal nitride layer 165 may be spaced apart from the capping insulating pattern CP with the second metal nitride layer 166 interposed therebetween. All elements, except for the afore-described features, may have substantially the same features as those in FIGS. 2A and 2B.

Figure 11A:
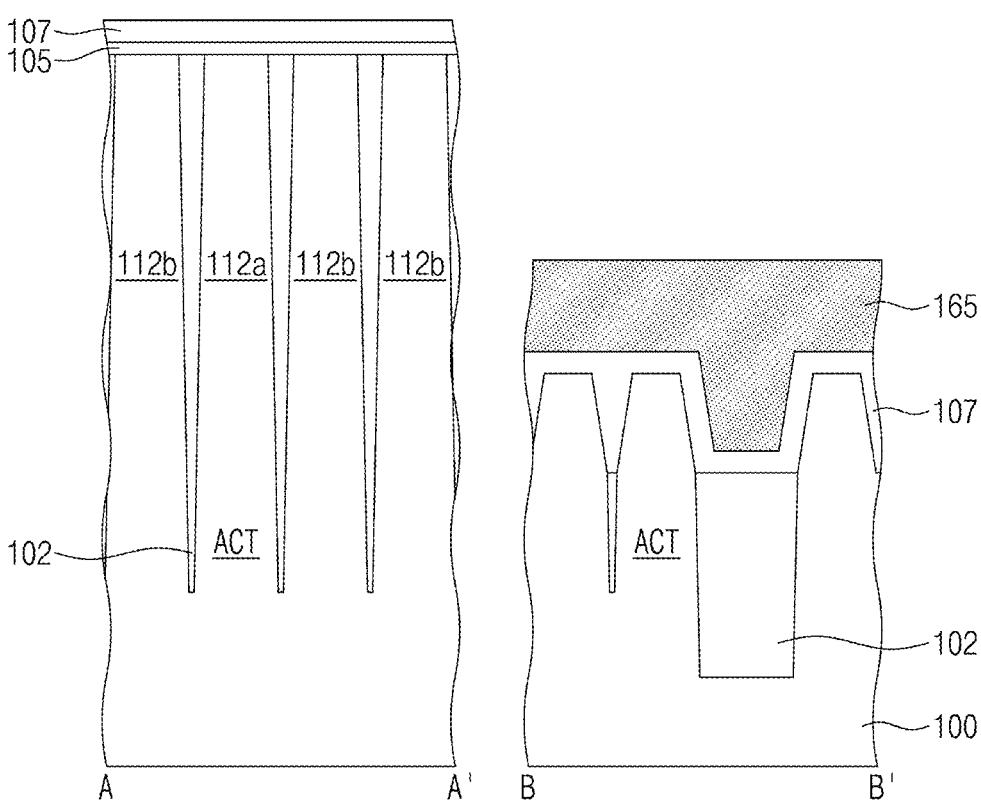
FIGS. 11A and 12A are sectional views, which are taken along the lines A1-A2 and B1-B2 of FIG. 1 to illustrate a method of fabricating a semiconductor memory device according to some example embodiments of the inventive concepts.
Figure 11B:
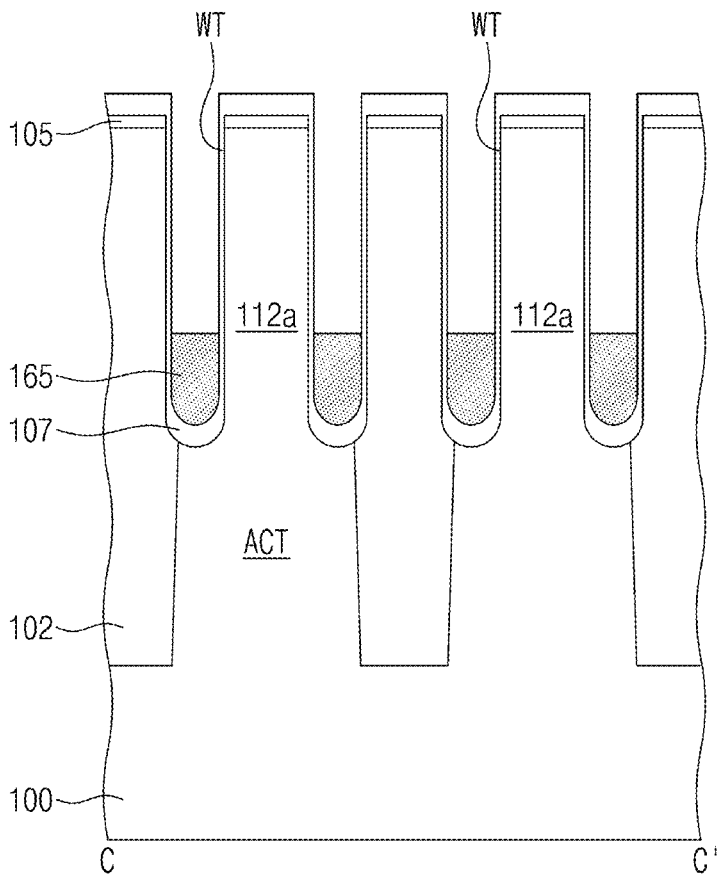
FIGS. 11B and 12B are sectional views, which are taken along the line C1-C2 of FIG. 1 to illustrate methods of fabricating a semiconductor memory device according to some example embodiments of the inventive concepts.
Figure 12A:
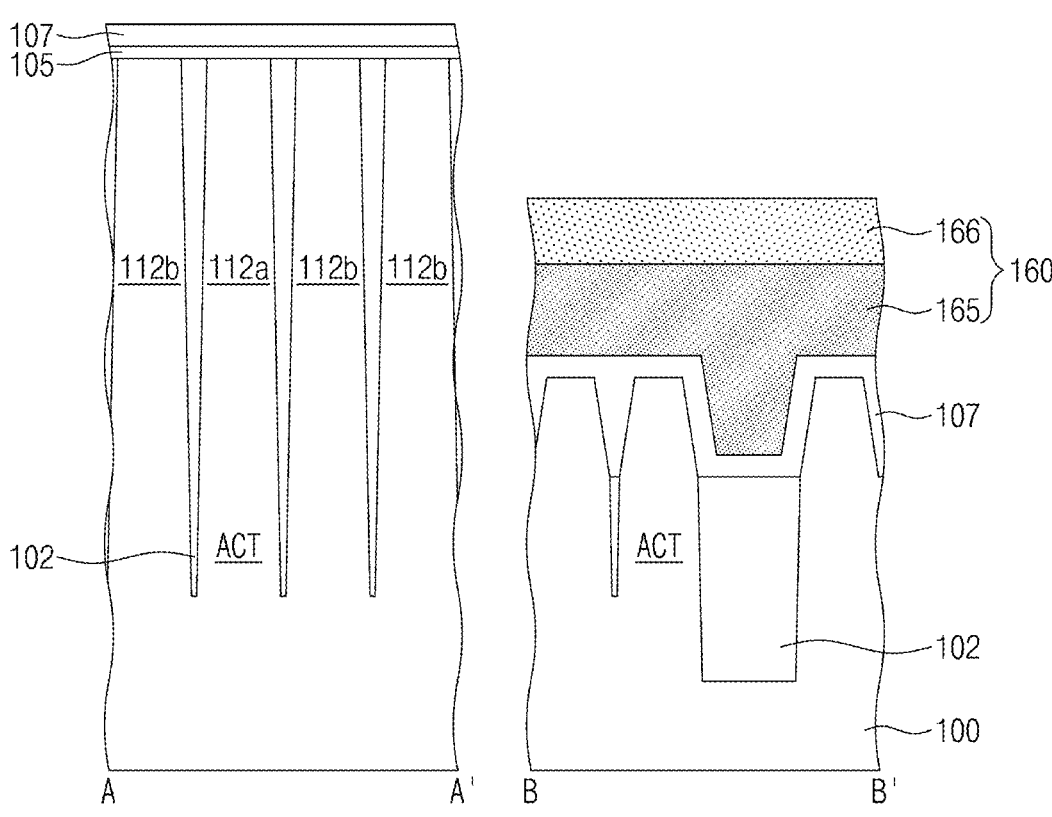
Figure 12B:
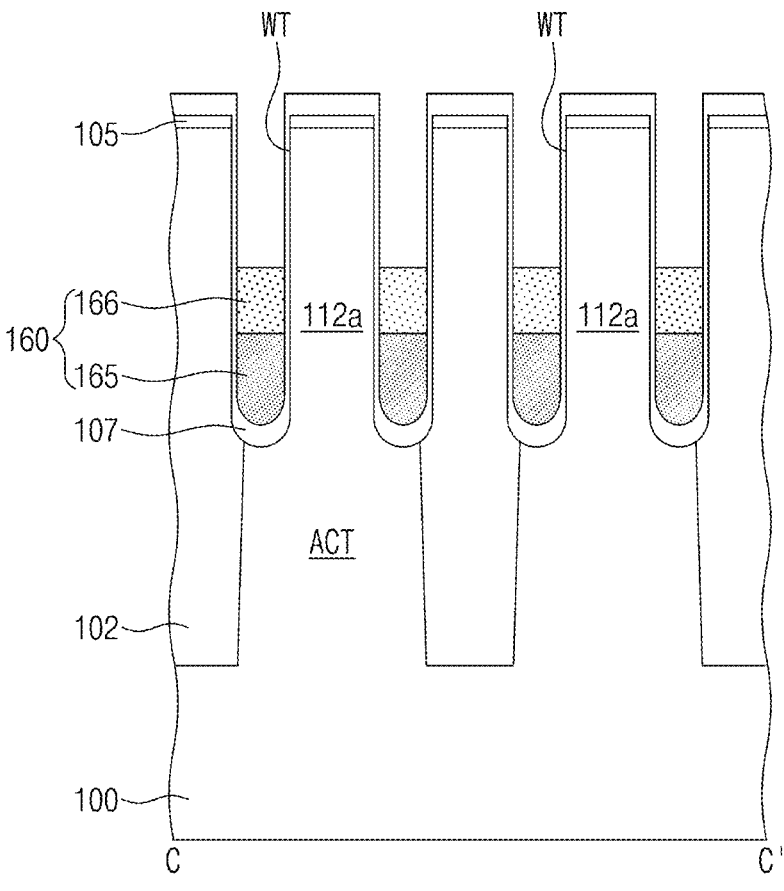

FIGS. 11A and 12A are sectional views, which are taken along the lines A1-A2 and B1-B2 of FIG. 1 to illustrate methods of fabricating a semiconductor memory devices according to some example embodiments of the inventive concepts. FIGS. 11B and 12B are sectional views, which are taken along the line C1-C2 of FIG. 1 to illustrate methods of fabricating semiconductor memory device according to some example embodiments of the inventive concepts. For concise description, a previously described element may be identified by the same reference number without repeating an overlapping description thereof.

Referring to FIGS. 1, 11A, and 11B, the first metal nitride layer 165 may be formed on the gate dielectric layer 107. The first metal nitride layer 165 may be formed by an ALD process. The first metal nitride layer 165 may contain the first element and the nitrogen. In some example embodiments, the first metal nitride layer 161 may include a TiN layer. A composition of the first metal nitride layer 161 may be controlled by adjusting a process cycle in the ALD process of injecting a source gas of the first element and a source gas of the nitrogen.

The formation of the first metal nitride layer 165 may include a planarization process. The planarization process may include a chemical mechanical polishing (CMP) process and/or an etch-back process. Thus, the first metal nitride layer 165 may be formed in a lower portion of each of the trenches WT.

Referring to FIGS. 1, 12A, and 12B, the second metal nitride layer 166 may be formed on the first metal nitride layer 165. The second metal nitride layer 166 may be formed by an ALD process. The second metal nitride layer 166 may contain the first element, the nitrogen, and the second element. The first element may be a metallic element, and the second element may be at least one of silicon (Si), tungsten (W), boron (B), aluminum (Al), lanthanum (La), tantalum (Ta), or yttrium (Y). In some example embodiments, the first element may be titanium. The second metal nitride layer 166 may be a TiSiN layer. A composition of the second metal nitride layer 166 may be controlled by adjusting a process cycle in the ALD process of injecting the source gas of the first element, the source gas of the nitrogen, and the source gas of the second element. In some example embodiments, the source gas of the second element may contain at least one of $SiH_4$, $SiH_3Cl$, $SiH_2Cl_2$, $HSiCl_3$, $SiCl_4$, $Si_2H_6$, hexachlorodisilane (HCDS) ($Si_2Cl_6$), diisopropylaminosilane (DIPAS) ($SiC_6H_{17}N$), tri(dimetrylamino)silane (TDMAS), $HSi((N(CH_3)_2)_3)$, bis(dietylamino)silane (BDEAS), or $H_2Si((N(C_2H_5)_2)_2)$.

The formation of the second metal nitride layer 166 may include a planarization process. The planarization process may include a CMP process and/or an etch-back process. Accordingly, the second metal nitride layer 166 may be formed in each of the trenches WT.

Next, the processes described with reference to FIGS. 9A and 9B and FIGS. 2A and 2B may be performed to fabricate the semiconductor memory device of FIGS. 10A and 10B.

Figure 13A:
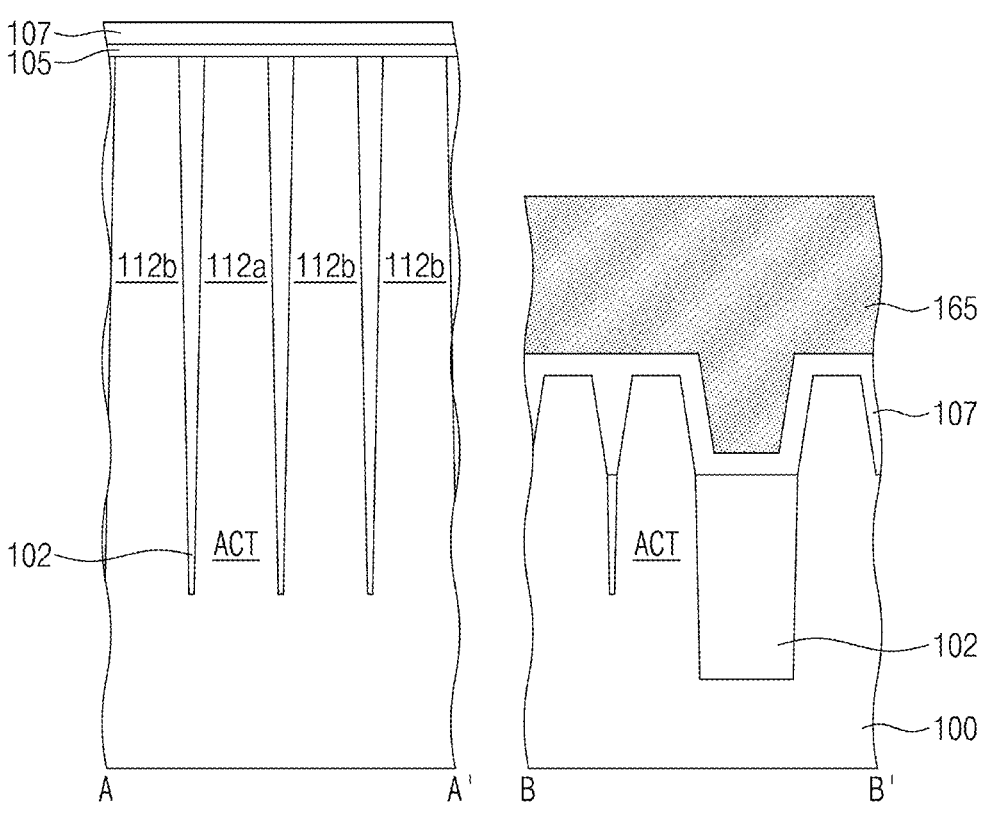
FIG. 13A is a sectional view, which is taken along the lines A1-A2 and B1-B2 of FIG. 1 to illustrate methods of fabricating a semiconductor memory device according to some example embodiments of the inventive concepts.
Figure 13B:
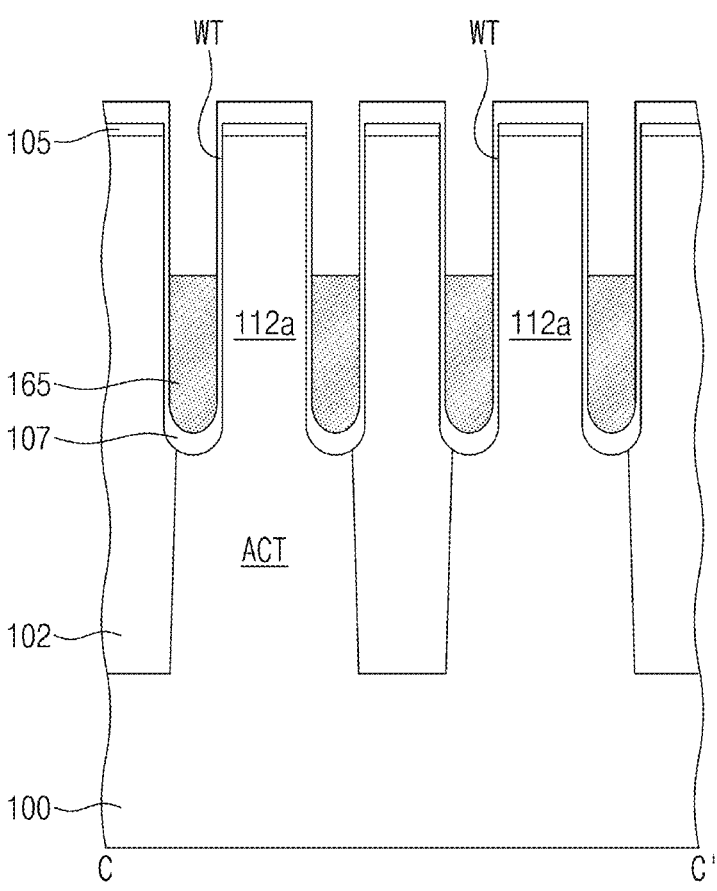
FIG. 13B is a sectional view, which is taken along the line C1-C2 of FIG. 1 to illustrate methods of fabricating a semiconductor memory device according to some example embodiments of the inventive concepts.

FIG. 13A is a sectional view, which is taken along the lines A1-A2 and B1-B2 of FIG. 1 to illustrate methods of fabricating semiconductor memory devices according to some example embodiments of the inventive concepts. FIG. 13B is a sectional view, which is taken along the line C1-C2 of FIG. 1 to illustrate a method of fabricating a semiconductor memory device according to some example embodiments of the inventive concepts. For concise description, a previously described element may be identified by the same reference number without repeating an overlapping description thereof.

Referring to FIGS. 1, 13A, and 13B, the first metal nitride layer 165 may be formed on the gate dielectric layer 107. The first metal nitride layer 165 may be formed by an ALD process. The first metal nitride layer 165 may contain the first element and the nitrogen. The first metal nitride layer 161 may include a TiN layer. A composition of the first metal nitride layer 165 may be controlled by adjusting a process cycle in the ALD process of injecting a source gas of the first element and a source gas of the nitrogen.

The formation of the first metal nitride layer 165 may include a planarization process. The planarization process may include a CMP process and/or an etch-back process. Thus, the first metal nitride layer 165 may be formed in each of the trenches WT. In the present example embodiment, the first metal nitride layer 165 may be formed to be thicker than the first metal nitride layer 165 described with reference to FIGS. 11A and 11B.

Referring back to FIGS. 1, 12A, and 12B, the second metal nitride layer 166 may be formed by performing a second treatment process on an upper portion of the first metal nitride layer 165 described with reference to FIGS. 1, 13A, and 13B. That is, as a result of the second treatment process, the upper portion of the first metal nitride layer 165 may form the second metal nitride layer 166. The second treatment process may include supply the source gas of the second element into a chamber. In some example embodiments, the second element may be at least one of silicon (Si), tungsten (W), boron (B), aluminum (Al), tantalum (La), tantalum (Ta), or yttrium (Y). In the case where the second element is silicon, the second metal nitride layer 166 may be a TiSiN layer. The silicon source may contain at least one of $SiH_4$, $SiH_3Cl$, $SiH_2Cl_2$, $HSiCl_3$, $SiCl_4$, $Si_2H_6$, hexachloro-disilane (HCDS) ($Si_2Cl_6$), diisopropylaminosilane (DIPAS) ($SiC_6H_{17}N$), tri(dimetrylamino)silane (TDMAS), HSi((N $(CH_3)_2)_3$), bis(dietylamino)silane (BDEAS), or $H_2Si((N (C_2H_5)_2)_2$). In some example embodiments, a silicon concentration of the second metal nitride layer 166 may range from 5 at % to 18 at %. A silicon concentration of the second metal nitride layer 166 may decrease as a distance from its top surface increases in a direction toward the third metal nitride layer 162, but the inventive concepts are not limited to this example; for example, the second metal nitride layer 166 may have substantially the same silicon concentration.

Next, the processes described with reference to FIGS. 9A and 9B and FIGS. 2A and 2B may be performed to fabricate the semiconductor memory device of FIGS. 10A and 10B.

According to some example embodiments of the inventive concepts, a plurality of metal nitride layers having different work functions may be used as a part of a word line. Thus, it may be possible to prevent or reduce in likelihood that the word line from is cut or has an excessively increased resistance. In addition, due to a silicon-containing metal nitride layer, it may be possible to prevent or reduce in likelihood a metal nitride layer under the silicon-containing metal nitride layer being oxidized and prevent or reduce in likelihood a void from being formed in the word line.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
active regions defined on a substrate by a device isolation layer, each of the active regions including a first impurity region and a second impurity region;
word lines on the active regions and extended in a first direction;
capping insulating patterns covering top surfaces of the word lines, respectively;
bit lines on the word lines and extended in a second direction crossing the first direction;
contact plugs between the bit lines and connected to the second impurity region; and
data storages on the contact plugs, respectively,
wherein each of the word lines includes,
a first metal nitride layer; and
a second metal nitride layer on the first metal nitride layer, and
wherein a resistivity of the second metal nitride layer is smaller than a resistivity of the first metal nitride layer.

2. The semiconductor memory device of claim 1, wherein the first metal nitride layer includes a first element and nitrogen,
the second metal nitride layer includes the first element, the nitrogen, and a second element,
the first element is a metallic element, and
the second element is silicon.

3. The semiconductor memory device of claim 2, wherein the first element is titanium.

4. The semiconductor memory device of claim 2, wherein a silicon concentration of the second metal nitride layer ranges from 5 at % to 18 at %.

5. The semiconductor memory device of claim 2, further comprising:
a third metal nitride layer between the first metal nitride layer and the second metal nitride layer; and
a fourth metal nitride layer on the second metal nitride layer.

6. The semiconductor memory device of claim 2, wherein a content ratio of the metallic element to the nitrogen in the first metal nitride layer is greater than or equal to 0.7 and is smaller than 1.0.

7. The semiconductor memory device of claim 5, wherein a nitrogen concentration of the first metal nitride layer is higher than a nitrogen concentration of the third metal nitride layer and a nitrogen concentration of the fourth metal nitride layer.

8. The semiconductor memory device of claim 5, wherein top surfaces of the first metal nitride layer, the second metal nitride layer, the third metal nitride layer, and the fourth metal nitride layer are in common contact with bottom surfaces of the capping insulating patterns.

9. The semiconductor memory device of claim 1, wherein the first metal nitride layer includes a first element and nitrogen,
the second metal nitride layer includes the first element, the nitrogen, and a second element,
the first element is a metallic element, and
the second element is at least one of silicon (Si), tungsten (W), boron (B), aluminum (Al), lanthanum (La), tantalum (Ta), or yttrium (Y).

10. The semiconductor memory device of claim 9, wherein
the second element in the second metal nitride layer is silicon, and
a silicon concentration of the second metal nitride layer decreases as a distance from the second metal nitride layer increases in a downward direction from its top surface toward its bottom surface.

11. A semiconductor memory device, comprising:

active regions defined on a substrate by a device isolation layer, each of the active regions including a first impurity region and a second impurity region;

word lines on the active regions and extended in a first direction;

capping insulating patterns covering top surfaces of the word lines, respectively;

bit lines on the word lines and extended in a second direction crossing the first direction;

contact plugs between the bit lines and connected to the second impurity region; and data storages on the contact plugs, respectively, wherein each of the word lines includes, a first metal nitride layer; and a second metal nitride layer on the first metal nitride layer, wherein a work function of the second metal nitride layer is smaller than a work function of the first metal nitride layer.

12. The semiconductor memory device of claim 11, wherein the first metal nitride layer includes a first element and nitrogen, the second metal nitride layer includes the first element, the nitrogen, and a second element, the first element is a metallic element, and the second element is silicon.

13. The semiconductor memory device of claim 12, wherein the first element is titanium.

14. The semiconductor memory device of claim 12, wherein a silicon concentration of the second metal nitride layer ranges from 5 at % to 18 at %.

15. The semiconductor memory device of claim 12, further comprising:

a third metal nitride layer between the first metal nitride layer and the second metal nitride layer; and a fourth metal nitride layer on the second metal nitride layer.

16. The semiconductor memory device of claim 12, wherein a content ratio of the metallic element to the nitrogen in the first metal nitride layer is greater than or equal to 0.7 and is smaller than 1.0.

17. The semiconductor memory device of claim 15, wherein a nitrogen concentration of the first metal nitride layer is higher than a nitrogen concentration of the third metal nitride layer and a nitrogen concentration of the fourth metal nitride layer.

18. A semiconductor memory device, comprising:

active regions defined on a substrate by a device isolation layer, each of the active regions including a first impurity region and a second impurity region;

word lines on the active regions and extended in a first direction;

capping insulating patterns covering top surfaces of the word lines, respectively;

bit lines on the word lines and extended in a second direction crossing the first direction;

contact plugs between the bit lines and connected to the second impurity region; and data storages on the contact plugs, respectively, wherein each of the word lines includes, a first metal nitride layer; and a second metal nitride layer on the first metal nitride layer, wherein the first metal nitride layer includes a first element and nitrogen, the second metal nitride layer includes the first element, the nitrogen, and a second element, the first element is titanium, and the second element is silicon.

19. The semiconductor memory device of claim 18, wherein the first metal nitride layer does not include silicon, and a silicon concentration of the second metal nitride layer ranges from 5 at % to 18 at %.

20. The semiconductor memory device of claim 18, further comprising:

a third metal nitride layer between the first metal nitride layer and the second metal nitride layer; and a fourth metal nitride layer on the second metal nitride layer, wherein a nitrogen concentration of the first metal nitride layer is higher than a nitrogen concentration of the third metal nitride layer and a nitrogen concentration of the fourth metal nitride layer.

* * * * *